(12) United States Patent
Li et al.

(10) Patent No.: US 11,177,293 B2
(45) Date of Patent: Nov. 16, 2021

(54) ARRAY SUBSTRATE AND FABRICATING METHOD THEREOF, AND DISPLAY DEVICE

(71) Applicant: BOE TECHNOLOGY GROUP CO., LTD., Beijing (CN)

(72) Inventors: Haixu Li, Beijing (CN); Jianguo Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 48 days.

(21) Appl. No.: 16/621,773

(22) PCT Filed: Dec. 14, 2018

(86) PCT No.: PCT/CN2018/121313
§ 371 (c)(1),
(2) Date: Dec. 12, 2019

(87) PCT Pub. No.: WO2019/114834
PCT Pub. Date: Jun. 20, 2019

(65) Prior Publication Data
US 2020/0152663 A1 May 14, 2020

(30) Foreign Application Priority Data

Dec. 15, 2017 (CN) .......................... 201711345541.8
Oct. 17, 2018 (CN) .......................... 201821680371.9

(51) Int. Cl.
*H01L 27/14* (2006.01)
*H01L 27/12* (2006.01)
*H01L 29/786* (2006.01)

(52) U.S. Cl.
CPC ........ *H01L 27/124* (2013.01); *H01L 27/1229* (2013.01); *H01L 27/1251* (2013.01);
(Continued)

(58) Field of Classification Search
CPC ............... H01L 27/124; H01L 27/1229; H01L 27/1251; H01L 29/78675; H01L 29/7869; H01L 27/1259
(Continued)

(56) References Cited

U.S. PATENT DOCUMENTS 8,455,876 B2 * 6/2013 Choi .................... H01L 27/1225
257/72
9,147,719 B2 * 9/2015 Kim .................... H01L 27/3276
(Continued)

FOREIGN PATENT DOCUMENTS

CN 106920515 7/2017
CN 106920801 7/2017
(Continued)

OTHER PUBLICATIONS

International Search Report and Written Opinion dated Mar. 13, 2019 for PCT Patent Application No. PCT/CN2018/121313.
(Continued)

*Primary Examiner* — Tan N Tran
(74) *Attorney, Agent, or Firm* — Thomas | Horstemeyer, LLP

(57) ABSTRACT

A fabricating method of an array substrate includes: forming a first semiconductor pattern and a first insulating layer on a substrate; forming a first gate pattern and a second gate pattern isolated from each other; forming a second insulating layer; forming a second semiconductor pattern; forming a first metal pattern and a second metal pattern and a third metal pattern respectively lap-jointed with the second semiconductor pattern; forming a third insulating layer; and forming a first via hole, a second via hole, first source and drain electrodes, and second source and drain electrodes, where the first source and drain electrode are respectively connected to the first semiconductor pattern through the first
(Continued)

via hole, and the second source and drain electrodes are respectively connected to the second semiconductor pattern through the second via hole.

13 Claims, 9 Drawing Sheets

(52) U.S. Cl.
CPC ...... *H01L 27/1259* (2013.01); *H01L 29/7869* (2013.01); *H01L 29/78675* (2013.01)

(58) Field of Classification Search
USPC .............................................. 257/43, 59, 72
See application file for complete search history.

(56) References Cited

U.S. PATENT DOCUMENTS

2011/0049523 A1    3/2011   Jong-Hyun et al.
2015/0123084 A1    5/2015   Jung-Bae et al.
2018/0219032 A1    8/2018   Junhui et al.

FOREIGN PATENT DOCUMENTS

| CN | 107452757 | | 12/2017 |
|---|---|---|---|
| CN | 107452757 A | * | 12/2017 |
| CN | 107910302 | | 4/2018 |
| TW | I585737 | | 6/2017 |
| TW | 201724072 | | 7/2017 |

OTHER PUBLICATIONS

1st Office Action dated Apr. 18, 2019 for Chinese Patent Application No. 201711345541.8.
Decision of Rejection dated Oct. 8, 2019 for Chinese Patent Application No. 201711345541.8.

* cited by examiner

ARRAY SUBSTRATE AND FABRICATING METHOD THEREOF, AND DISPLAY DEVICE

CROSS-REFERENCE TO RELATED APPLICATIONS

The present application is based upon PCT Application No. PCT/CN2018/121313, filed on Dec. 14, 2018, which is based upon and claims priority to Chinese Patent Application No. 201711345541.8, filed on Dec. 15, 2017 and Chinese Patent Application No. 201821680371.9, filed on Oct. 17, 2018, the entire contents of which are incorporated herein by reference.

TECHNICAL FIELD

The present disclosure relates to the field of display technologies and, in particular, to an array substrate and a fabricating method thereof, and a display device including the array substrate.

BACKGROUND

AMOLED (active matrix organic light emitting diode) technology is a development trend of mobile products. A thin film transistor (TFT) used as a switch of a pixel is required to have a leakage current (Ioff) as small as possible, and a TFT using an oxide semiconductor can reduce the leakage current. However, since the oxide semiconductor has low carrier mobility, it is sometimes difficult to form a drive circuit built in a display device using a TFT with an oxide semiconductor. On the other hand, since a Low Temperature Poly-Si (LTPS) TFT has a large carrier mobility, a drive circuit can be formed by using the LTPS TFT. However, in the case where LTPS is used as a switching TFT in the pixel, the leakage current of LTPS is large.

The LTPO (LTPS+Oxide, i.e., a combination of low-temperature polysilicon and Oxide semiconductor) technology combines respective advantages of the LTPS TFT and the Oxide TFT, and has certain technical advantages in aspects of high PPI, low power consumption, high image quality, and the like of a mobile AMOLED product. In addition, since Oxide TFT has the advantage of low leakage current, it also has certain advantages in sensor application of LTPS+Oxide technology. Therefore, the development of the LTPO process has higher value and significance.

SUMMARY

According to a first aspect of the present disclosure, a fabricating method of an array substrate is provided. The array substrate includes a substrate including a first region and a second region. The fabricating method includes:

forming a first semiconductor pattern in the first region;

forming a first insulating layer at least covering the first semiconductor pattern;

forming a first gate pattern and a second gate pattern isolated from each other in the first region and the second region, respectively;

forming a second insulating layer at least covering the first gate pattern;

forming a second semiconductor pattern in the second region;

forming a first metal pattern in the first region and forming a second metal pattern and a third metal pattern respectively lap-jointed with the second semiconductor pattern in the second region by one film forming process;

forming a third insulating layer at least covering the second semiconductor pattern, the first metal pattern, the second metal pattern and the third metal pattern;

forming a first via hole penetrating through the first insulating layer, the second insulating layer, and the third insulating layer in the first region, and forming a second via hole penetrating through the third insulating layer in the second region; and forming a first source electrode and a first drain electrode, a second source electrode and a second drain electrode, wherein the first source electrode and the first drain electrode are respectively connected to the first semiconductor pattern through the first via hole, and the second source electrode and the second drain electrode are respectively connected to the second semiconductor pattern through the second via hole.

In some embodiments, the first gate pattern and the second gate pattern are disposed at the same layer, and the second insulating layer covers the first gate pattern and the second gate pattern.

In other embodiments, the method further includes forming a first gate insulating layer on the second semiconductor pattern, wherein the second gate pattern is on the first gate insulating layer, and wherein the third insulating layer covers the second semiconductor pattern, the first metal pattern, the second metal pattern and the third metal pattern, and the first gate insulating layer and the second gate pattern.

In other embodiments, the first semiconductor pattern is made of polysilicon, and wherein the second semiconductor pattern is made of one of or combination of more of indium zinc oxide, indium tin zinc oxide, indium gallium oxide, indium gallium zinc oxide, indium tungsten oxide, zinc oxide, tin oxide, gallium zinc oxide, and zinc tin oxide.

In other embodiments, the second source electrode is connected to the second metal pattern through the second via hole, and the second drain electrode is connected to the third metal pattern through the second via hole.

In other embodiments, a process of forming the first via hole and the second via includes: forming the first via hole and the second via hole in a same exposure process; and cleaning the first via hole and the second via hole by hydrofluoric acid.

According to a second aspect of the present disclosure, an array substrate is provided. The array substrate includes:

a substrate including a first region and a second region;

a first semiconductor pattern located in the first region;

a first insulating layer at least covering the first semiconductor pattern;

a first gate pattern and a second gate pattern isolated from each other and disposed in the first region and the second region, respectively;

a second insulating layer at least covering the first gate pattern;

a first metal pattern located on the second insulating layer of the first region;

a second semiconductor pattern located on the second insulating layer of the second region;

a second metal pattern and a third metal pattern, which are located in the second region and respectively lap jointed with the second semiconductor pattern;

a third insulating layer at least covering the second semiconductor pattern, the first metal pattern, the second metal pattern, and the third metal pattern;

a first via hole located in the first region and penetrating the first insulating layer, the second insulating layer, and the third insulating layer;

a second via hole located in the second region and penetrating through the third insulating layer;

a first source electrode and a first drain electrode; and a second source electrode and a second drain electrode, where, the first source electrode and the first drain electrode are respectively connected to the first semiconductor pattern through the first via hole, and the second source electrode and the second drain electrode are respectively connected to the second semiconductor pattern through the second via hole.

In some embodiments, the first gate pattern and the second gate pattern are disposed at the same layer, and the second insulating layer covers the first gate pattern and the second gate pattern.

In some embodiments, the second metal pattern and the third metal pattern are made of the same material.

In some embodiments, the array substrate further includes a first gate insulating layer located on the second semiconductor pattern, where the second gate pattern is located on the first gate insulating layer, and wherein the third insulating layer covers the second semiconductor pattern, the first metal pattern, the second metal pattern, and the third metal pattern, the first gate insulating layer and the second gate pattern.

In some embodiments, an orthographic projection of the second metal pattern and the third metal pattern on the substrate covers an orthographic projection of the second via hole on the substrate.

In some embodiments, the second metal pattern and the third metal pattern are disposed in the same layer as the second gate pattern.

In some embodiments, a width of the first gate insulating layer is greater than a width of the second gate pattern.

In some embodiments, the first semiconductor pattern, the first via hole, the first source electrode, and the first drain electrode are connected to the first semiconductor pattern through the first via hole, and the first gate pattern and the first metal pattern formed over the first semiconductor pattern constitute a low temperature polysilicon thin film transistor.

In some embodiments, the first metal pattern is disposed in the same layer as the second metal pattern, the third metal pattern, and the second gate pattern.

In some embodiments, the first metal pattern is made of the same material as the second metal pattern, the third metal pattern, and the second gate pattern.

According to a third aspect of the present disclosure, a display device is provided. The display device includes the above-mentioned array substrate.

DETAILED DESCRIPTION

Figure 1:
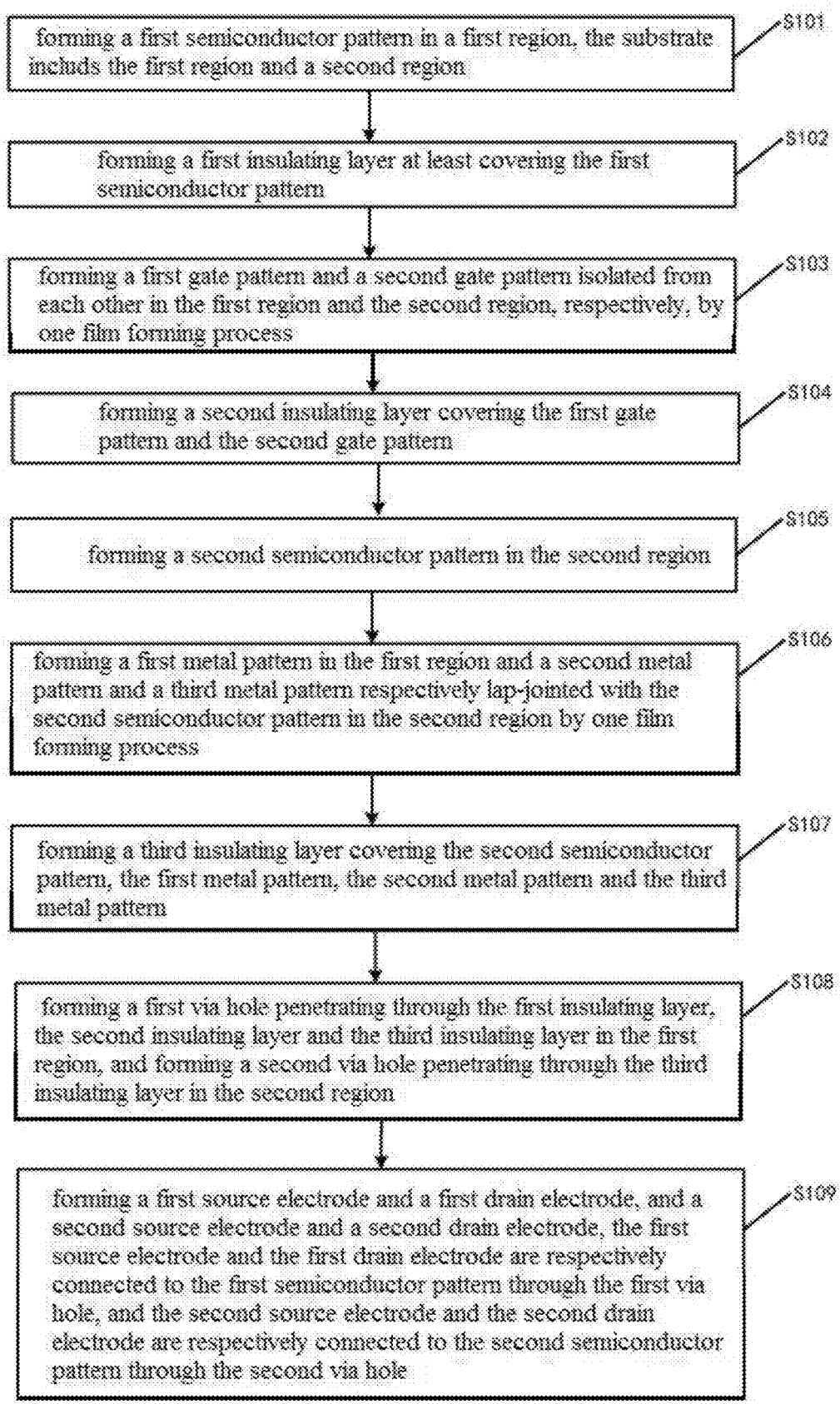
FIG. 1 is a process flow chart of a fabricating method of an array substrate according to the present disclosure.

The inventors have found that, for LTPS and an oxide semiconductor, there are problems such as process incompatibility when they are formed on the same substrate due to different properties of materials. In the process of fabricating LTPS TFTs in the related art, a via hole penetrating through a plurality of insulating layers needs to be formed to connect source and drain electrodes to a semiconductor layer made of polysilicon. After the via hole is formed, the surface of the polysilicon layer is oxidized since the corresponding position in the polysilicon layer is exposed to air, and therefore, a hydrofluoric acid (HF) cleaning is required to remove the surface oxide before forming the source/drain electrode. However, if the hydrofluoric acid contacts the oxide semiconductor during the hydrofluoric acid cleaning process, the hydrofluoric acid will corrode the oxide semiconductor and cause damage, thereby affecting the performance of Oxide TFT.

The technical solution of the present disclosure is further explained below according to specific embodiments. The scope of protection of the present disclosure is not limited to the following embodiments, which are set forth for illustrative purposes only and do not limit the present disclosure in any way.

It should be understood that the drawings disclosed herein are not necessarily drawn to scale as actual devices or elements. The shapes and thicknesses of the embodiments may be exaggerated in the drawings in order to clearly show the features of the embodiments of the present disclosure. Furthermore, the structures and devices in the drawings are schematically depicted in order to clearly illustrate the features of the embodiments of the present disclosure.

It should also be understood that the first and second regions mentioned in this disclosure are not limited to the substrate itself, but may include a range of regions in the vertical direction thereof.

FIG. 1 is a process flow chart of a fabricating method of an array substrate of the present disclosure. As shown in FIG. 1, the fabricating method of the array substrate of the present disclosure includes:

Step S101: forming a first semiconductor pattern in a first region, wherein the array substrate includes a substrate including the first region and a second region;

Step S102: forming a first insulating layer at least covering the first semiconductor pattern;

Step S103: forming a first gate pattern and a second gate pattern isolated from each other in the first region and the second region, respectively, by one film forming process;

Step S104: forming a second insulating layer covering the first gate pattern and the second gate pattern;

Step S105: forming a second semiconductor pattern in the second region;

Step S106: forming a first metal pattern in the first region and a second metal pattern and a third metal pattern respectively lap jointed with the second semiconductor pattern in the second region by one film forming process;

Step S107: forming a third insulating layer covering the second semiconductor pattern, the first metal pattern, the second metal pattern and the third metal pattern;

Step S108: forming a first via hole penetrating through the first insulating layer, the second insulating layer and the third insulating layer in the first region, and forming a second via hole penetrating through the third insulating layer in the second region; and Step S109: forming a first source electrode and a first drain electrode, and a second source electrode and a second drain electrode, wherein the first source electrode and the first drain electrode are respectively connected to the first semiconductor pattern through the first via hole, and the second source electrode and the second drain electrode are respectively connected to the second semiconductor pattern through the second via hole.

Figure 2:
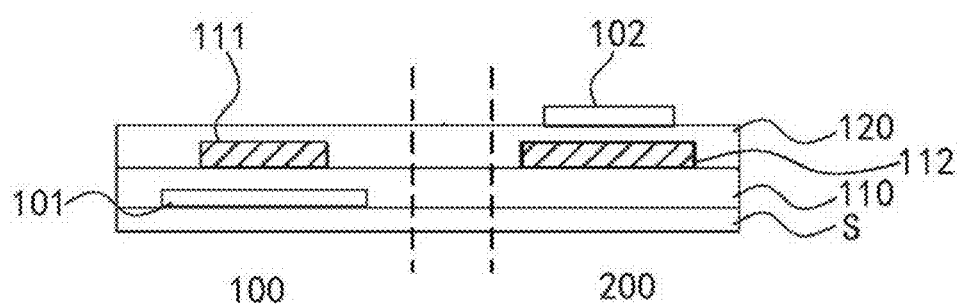
FIGS. 2 to 5 are schematic cross-sectional views illustrating a process of a fabricating method of an array substrate according to the present disclosure.

FIGS. 2 to 5 are schematic cross-sectional views illustrating a process of a fabricating method of an array substrate according to an embodiment of the present disclosure. As shown in FIG. 2, the array substrate includes a substrate S, and a material of the substrate S may be quartz glass, alkali-free glass, silicon wafer, polyimide, plastic, or the like. The substrate S has a plurality of first regions 100 and a plurality of second regions 200 (only one is shown in each figure) to form different types of TFTs in the two regions, respectively. For example, the oxide semiconductor TFT acts as a switching element of a pixel in the display region and LTPS TFT acts as a driving element of the drive circuit.

First, a first semiconductor pattern 101 is formed in a first region 100 of a substrate S by one composition process. The first semiconductor pattern 101 acts as an active layer of a TFT corresponding to the first region 100. A material of the first semiconductor pattern 101 may be polysilicon, and the TFT corresponding to the first region 100 is an LTPS TFT.

It should be understood that a light blocking pattern and an insulating layer may be formed before the first semiconductor pattern 101 is formed in the first region 100 of the substrate S. The light blocking pattern may adopt amorphous silicon, dark resin, or a metal material, thereby preventing light incident from the substrate side from affecting working characteristics of the semiconductor device.

The formation of the first semiconductor pattern 101 may include the following steps of: forming amorphous silicon (a-Si) in the first region 100 of the substrate S and then irradiating the amorphous silicon with excimer laser, thereby converting amorphous silicon into polysilicon silicon.

A stack of a silicon nitride (SiNx) layer and a silicon oxide (SiOx) layer may also be formed on the substrate S before the first semiconductor pattern 101 is formed, thereby preventing impurities contained in the substrate S from contaminating the first semiconductor pattern 101.

After the first semiconductor pattern 101 is formed, a first insulating layer 110 is formed thereon. The first insulating layer 110 at least covers the first semiconductor pattern 101, and may further cover the first region 100, and may further cover the second region 200. The material of the first insulating layer 110 may be a silicon oxide (SiOx) layer, which may be formed with TEOS (tetraethoxysilane) as a raw material by using a CVD (chemical vapor deposition) method such as a low pressure chemical vapor deposition method, a thermal vapor deposition method, a catalytic chemical vapor deposition method, a plasma enhanced chemical vapor deposition method, and the like.

The first gate pattern 111 and the second gate pattern 112 are respectively formed in the first region 100 and the second region 200 with the same mask plate and the same material by one film forming process, and the first gate pattern 111 and the second gate pattern 112 are isolated from each other. The first gate pattern 111 and the second gate pattern 112 are formed of Al alloy, Cr, Mo, W, or a laminated film thereof, and serve as gate electrodes of TFTs in two regions, respectively. The first gate pattern 111 and the second gate pattern 112 may be formed by a coating film method including, but not limited to, vacuum evaporation, magnetron sputtering, ion sputtering, and the like.

The first gate pattern 111 is formed on the first insulating layer 110 and directly above the first semiconductor pattern 101. If the first insulating layer 110 also covers the second region 200, the second gate pattern 112 may be formed on the first insulating layer 110, and if the first insulating layer 110 only covers the first region 100, the second gate pattern 112 may be directly formed on the second region 200 of the substrate S.

After the first gate pattern 111 and the second gate pattern 112 are formed, a second insulating layer 120 is formed thereon. The second insulating layer 120 completely covers the first gate pattern 111 and the second gate pattern 112, and also covers the first insulating layer 110 and the substrate S.

In order to secure the performance of the oxide semiconductor TFT, the material of the second insulating layer 120 is a stack of a silicon nitride layer and a silicon oxide layer, in which the silicon nitride layer is positioned below and the silicon oxide layer is positioned above so that the silicon oxide layer is in contact with the oxide semiconductor layer.

The raw material and the forming method of the silicon oxide layer may be the same as above. In terms of a source gas for forming a silicon nitride layer, NH3, NH2H2N, N2, and the like, alternatively NH3 and N2, can be used as a nitrogen source gas, and SiH4, Si2H6, SiCl4, SiHCl3, SiH2Cl2, SiH3Cl3, SiF4, and the like, alternatively SiH4, can be used as a silicon source gas. The silicon nitride layer may also be formed by a chemical vapor deposition method (CVD).

It should be noted that, for the LTPS TFT, after the via hole connecting the source/drain electrode and the active layer is formed, the surface of the polysilicon semiconductor pattern exposed through the via hole needs to be cleaned with hydrofluoric acid, and meanwhile, the source/drain electrode needs to be formed within less than half an hour after the hydrofluoric acid is cleaned. Otherwise, the cleaned polysilicon surface is exposed to water vapor or air and oxidized to form a surface oxide again, which affects the lap joint and reduces the cleaning effect. In order to further save the process flow and reduce the fabricating cost, it is necessary to fabricate the second semiconductor pattern 102 (typically, an oxide semiconductor layer, such as IGZO) and then perform dry etching (Dry Etch) punching, followed by hydrofluoric acid cleaning and source/drain deposition in sequence.

Therefore, after the second insulating layer 120 is formed, the second semiconductor pattern 102 is formed in the second region 200. The second semiconductor pattern 102 is an active layer of a TFT corresponding to the second region 200, and the material of the second semiconductor pattern 102 may be a metal oxide, in which case the TFT corresponding to the second region 200 is an oxide semiconductor TFT.

The material of the second semiconductor pattern 102 may be any one of indium zinc oxide (IZO), Indium Tin Zinc Oxide (ITZO), indium gallium oxide (IGO), indium gallium zinc oxide (IGZO), Indium tungsten Oxide (IWO), zinc oxide (ZnO), stannic oxide (SnO), Gallium Zinc Oxide (GZO), and Zinc Tin Oxide (ZTO), and may be a combination of more of the above materials.

The second semiconductor pattern 102 may be formed by a film coating method including, but not limited to, vacuum evaporation, magnetron sputtering coating, ion sputtering coating, and the like. Taking IGZO as an example, direct current magnetron sputtering may be used, in which an atomic ratio of a target material is that In2O3-Ga2O3-ZnO=1:1:1 (molar ratio), and the IGZO film meeting the application requirements can be obtained by adjusting parameters such as oxygen flow, deposition power, gas flow, and the like.

Figure 3:
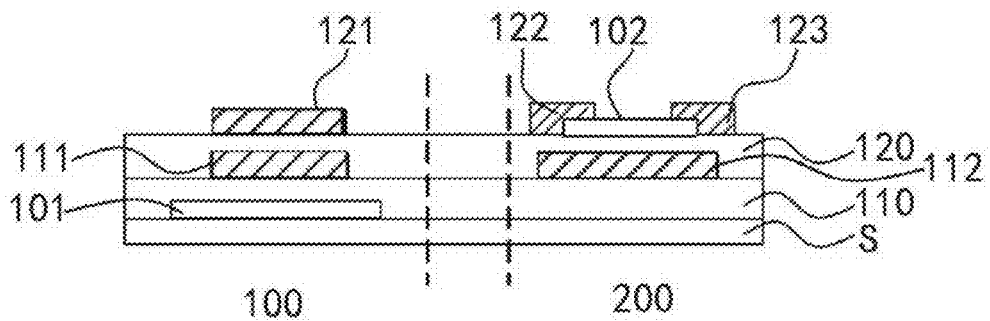

The second semiconductor pattern 102 may be formed directly on the second insulating layer 120 and directly over the second gate pattern 112. As shown in FIG. 3, after the second semiconductor pattern 102 is formed, a first metal pattern 121 is formed in the first region 100, a second metal pattern 122, and a third metal pattern 123 are formed in the second region 200 by one film forming process using the same mask plate and the same material, and the second metal pattern 122 and the third metal pattern 123 are respectively lap-jointed with the second semiconductor pattern 102 while the second metal pattern 122 and the third metal pattern 123 are not in contact with each other.

The material of any of the first metal pattern 121, the second metal pattern 122, and the third metal pattern 123 may be a metal that does not react or reacts very slowly with HF at normal temperature, such as Mo, which may be formed by means of film coating.

The first metal pattern 121 is disposed on the second insulating layer 120 in the first region 100, and may serve as a trace for connecting polysilicon cells having different functions, such as a connection line for connecting a switching TFT and a driving TFT; may correspond to the first gate pattern 111 to function as a storage capacitor, thereby maintaining the pixel display of the light emitting unit. The first gate pattern as the LTPS TFT gate is located at a different position of the same layer as the first gate pattern acting as the capacitor.

The second metal pattern 122 and the third metal pattern 123 are respectively formed at two sides of the second semiconductor pattern 102 and connected thereto, and considering the connection stability, a portion of each of the second metal pattern 122 and the third metal pattern 123 may be located at a side of the second semiconductor pattern 102 and another portion of each of the second metal pattern 122 and the third metal pattern 123 may be located on the second semiconductor pattern 102 in a lap-joint manner, so as to form a stable connection structure without being easily broken.

Figure 4:
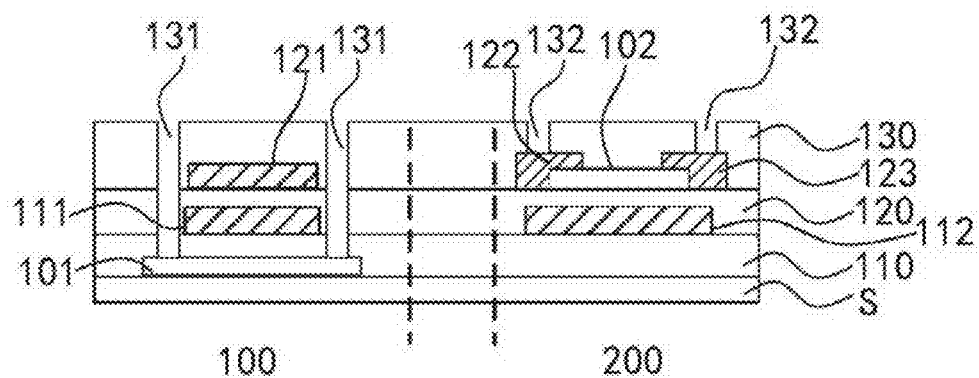

As shown in FIG. 4, after the first metal pattern 121, the second metal pattern 122 and the third metal pattern 123 are formed, a third insulating layer 130 is formed thereon. The third insulating layer 130 completely covers the first metal pattern 121, the second metal pattern 122, the third metal pattern 123, and the second semiconductor pattern 102.

The third insulating layer 130 has good coverage and insulating effects, and may be an interlayer dielectric layer, such as a silicon nitride layer, a silicon oxide layer, a stack layer of a silicon nitride layer and a silicon oxide layer, and the like, wherein the raw materials and the forming methods of the silicon oxide layer and the silicon oxide layer may be the same as above.

After the third insulating layer 130 is formed, it is etched to form a plurality of first via holes 131 and a plurality of second via holes 132. As shown in FIG. 4, two first via holes 131 are formed in the first region 100, which penetrates through an insulating layer 110, the second insulating layer 120 and the third insulating layer 130, thereby exposing the first semiconductor pattern 101; two second via holes 132 are formed in the second region 200, which penetrates through the third insulating layer 130, thereby exposing the second metal pattern 122 and the third metal pattern 123.

The formation of the first via hole 131 and the second via hole 132 may be simultaneously performed in the same exposure process using dry etching, which may be performed using a CF-based (CF4) or CHF-based (CHF3) gas.

After the first via hole 131 and the second via hole 132 are formed, a hydrogenation process may be performed on the LTPS to fill an interface state, a grain boundary state, an oxide layer defect, and the like with hydrogen atoms, and the hydrogenation process may be performed by a plasma hydrogenation method, a solid diffusion method, a hydrogen ion implantation method, or the like.

Figure 5:
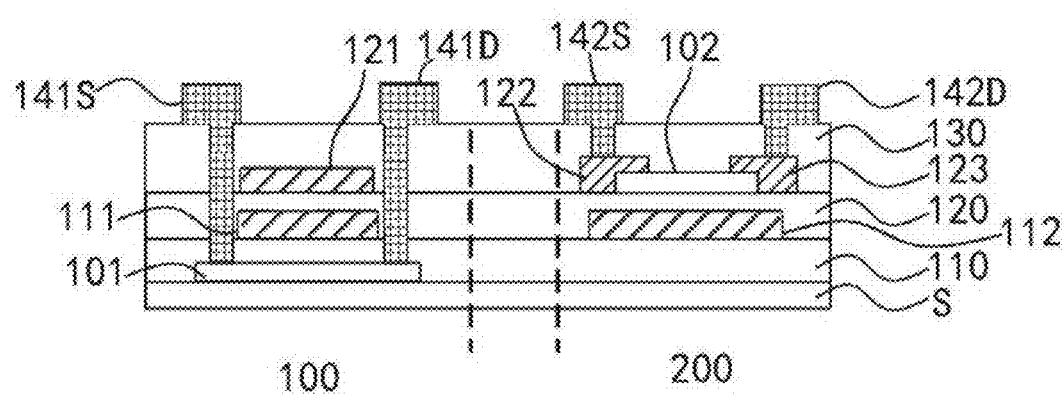

The first insulating layer is usually made of silicon oxide, and the polysilicon is easily oxidized by an oxygen atmosphere during the etching process, therefore, after the hydrogenation process, the first via hole 131 and the second via hole 132 are required to be cleaned with a hydrofluoric acid to remove the silicon oxide and the polymer on the surface of the polysilicon (p-Si) in the first via hole 131, so as to prevent the silicon oxide and the polymer from affecting the subsequent lap-joint and contact between the source/drain electrode and the polysilicon, thereby ensuring the device characteristics of the LTPS. Since the second via hole 132 exposes only the second metal pattern 122 and the third metal pattern 123, the hydrofluoric acid does not contact and thus does not react with the second semiconductor pattern 102 when the hydrofluoric acid cleaning is performed, and meanwhile, the corrosion of the hydrofluoric acid to the second metal pattern 122 and the third metal pattern 123 is limited, and the hydrofluoric acid does not completely corrode and contact the second semiconductor pattern 102, so that the damage caused by the hydrofluoric acid corroding the oxide semiconductor can be avoided, and the performance of the oxide semiconductor TFT is not affected. As shown in FIG. 5, after the hydrofluoric acid cleaning, a first source electrode 141S and a first drain electrode 141D are formed on the first region 100, and a second source electrode 142S and a second drain electrode 142D are formed on the second region 200.

In addition to low resistivity as a requirement of the TFT on source/drain electrode, the source/drain electrode and the semiconductor layer form good ohmic contact as another important requirement, so that the resistance between the drain electrode and the source electrode can be reduced, and the current crowding effect can be prevented.

The first source electrode 141S, the first drain electrode 141D, the second source electrode 142S, and the second drain electrode 142D may be simultaneously formed by one film forming process, and may be made of metal Ti, ITO, or the like, the metal Ti material has a good adhesion capability with the IGZO layer, and can also reduce a contact resistance with the active layer. The ITO material has a low resistivity, can form a good ohmic contact with the IGZO active layer, and has a good transparency.

As shown in FIG. 5, a portion of each of the first source electrode 141S and the first drain electrode 141D is formed on the third insulating layer 130 and connected to the first semiconductor pattern 101 through two first via holes 131, respectively; the second source electrode 142S is connected to the second metal pattern 122 through one second via hole 132, the second drain electrode 142D is connected to the third metal pattern 123 through another second via hole 132, and the second metal pattern 122 and the third metal pattern 123 are respectively lap jointed with the second semiconductor pattern 102, thereby realizing the electrical connection between the second source electrode 142S and the second drain electrode 142D and the second semiconductor pattern 102.

After the source electrode and the drain electrode are formed, a passivation layer (not shown) may be further formed on the third insulating layer 130 to cover the source electrode and the drain electrode, and then the subsequent processes may be smoothly performed.

In the above description, the oxide semiconductor TFT is used for the display region and the LTPS TFT is used for the peripheral drive circuit. However, depending on product specifications, the oxide semiconductor TFT may be added to the peripheral circuit and the LTPS TFT may be added to the display region.

As shown in FIG. 5, the array substrate of the present disclosure includes:

a substrate S including a first region 100 and a second region 200;

a first semiconductor pattern 101 located in the first region 100;

a first insulating layer 110 at least covering the first semiconductor pattern 101;

a first gate pattern 111 and a second gate pattern 112 isolated from each other, and disposed in the first region 100 and the second region 200, respectively;

a second insulating layer 120 covering the first gate pattern 111 and the second gate pattern 112;

a first metal pattern 121 located on the second insulating layer 120 of the first region 100;

a second semiconductor pattern 102 located on the second insulating layer 120 of the second region 200;

a second metal pattern 122 and a third metal pattern 123 located in the second region 200 and lap-jointed with the second semiconductor pattern 102, respectively;

a third insulating layer 130 covering the second semiconductor pattern 102, the first metal pattern 121, the second metal pattern 122, and the third metal pattern 123;

a first via hole 131 located in the first region 100 and penetrating through the first insulating layer 110, the second insulating layer 120, and the third insulating layer 130;

a second via hole 132 located in the second region 200 and penetrating through the third insulating layer 130;

a first source electrode 141S and a first drain electrode 141D located on the third insulating layer 130 of the first region 100; and a second source electrode 142S and a second drain electrode 142D located on the third insulating layer 130 of the second region 200;

wherein the first source electrode 141S and the first drain electrode 141D are connected to the first semiconductor pattern 101 through the first via hole 131, respectively, and the second source electrode 142S and the second drain electrode 142D are connected to the second semiconductor pattern 102 through the second via hole 132, respectively.

In one embodiment, the first metal pattern 121, the second metal pattern 122, and the third metal pattern 123 may be formed of the same material by one film forming process.

Therefore, in the fabricating method of the present disclosure, a position of the film layer of the oxide semiconductor in the array substrate is changed, a lap-joint structure is provided on the two sides of the film layer, the oxide semiconductor layer is effectively protected by the lap joint structure, the normal cleaning of hydrofluoric acid after the via hole are formed by the one composition process can be realized, thereby avoiding the influence of the hydrofluoric acid on the oxide semiconductor layer, simplifying the fabricating process, and reducing the production cost.

By using the fabricating method of the present disclosure, the LTPS TFT and the oxide semiconductor TFT can be simultaneously formed through a common process, and thus various combinations of the LTPS TFT and the oxide semiconductor TFT can be used, so that an organic electroluminescent display device excellent in image quality and capable of reducing power consumption can be obtained.

Some illustrative alternative embodiments of the present disclosure are described below.

Figure 6:
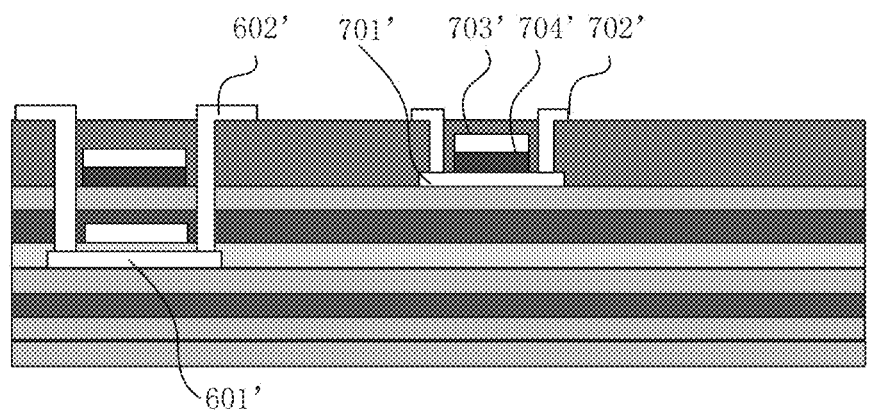
FIG. 6 is a schematic view of an array substrate in the related art.

As shown in FIG. 6, in the LTPO array substrate of the related art, on one hand, in order to reduce the use of mask plates and simplify the process flow, the first via hole 602' of the low temperature polysilicon thin film transistor and the second via hole 702' of the oxide thin film transistor are typically formed by one exposure etching process, however, since a depth of the first via hole 602' is deeper than a depth of the second via hole 702', when the second via hole 702' has been etched, etching of a portion of the first via hole 602' is still not completed, and the etching time is required to be prolonged to allow the first via hole 602' to reach the polysilicon semiconductor layer 601', and to expose the polysilicon semiconductor layer 601'. In the continuing etching, the oxide semiconductor 701' continues to be etched in the second via hole 702', which may cause the oxide semiconductor 701' to be completely etched away in the subsequent etching time, thereby causing the performance of the oxide thin film transistor to be abnormal. However, if the first via hole 602' and the second via hole 702' are formed by two processes, the number of used mask plates is increased, the process complexity is increased, and the fabricating cost of the array substrate is increased. On the other hand, after the first via hole 602' is formed, the low temperature polysilicon thin film transistor needs to be cleaned with hydrofluoric acid (HF) to remove the oxide layer on the surface of the polysilicon (p-Si), and then the source electrode and the drain electrode are deposited to ensure that the source electrode and the drain electrode form a good ohmic contact with the polysilicon semiconductor layer. However, when the array substrate is cleaned with HF, the HF reacts with the oxide semiconductor layer 701' to etch the oxide semiconductor layer 701', which causes the performance of the oxide thin film transistor to be abnormal. If a barrier layer is formed at the second via hole 702' before the HF cleaning, and is removed after the HF cleaning, the process may be complicated and the cost may also be increased. Still on the other hand, due to the current process limitation of the array substrate, the gate electrode 703' and the gate insulating layer 704' of the oxide semiconductor are generally formed by one process, so that the width of the gate insulating layer 704' is short, and when the oxide semiconductor layer 701' is conducted, an effective length of an oxide semiconductor channel is reduced since there is no enough the gate insulating layer 704' to perform protection, thereby causing a short channel effect, and making the characteristics of the oxide thin film transistor unstable.

Figure 7:
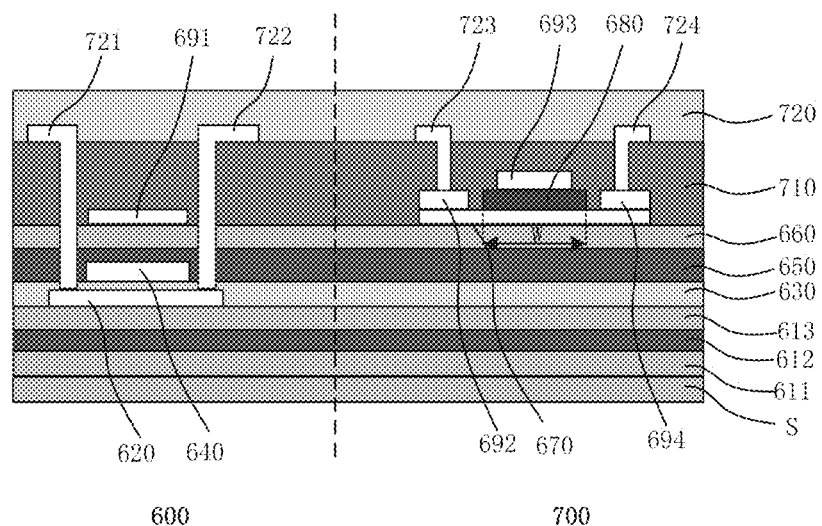
FIG. 7 is a schematic view of a specific embodiment of an array substrate according to the present disclosure.

As shown in FIG. 7, according to one aspect of the present disclosure, a specific embodiment of an array substrate is disclosed. In this embodiment, the array substrate includes a substrate S, and a low temperature polysilicon thin film transistor (LTPS TFT) and an oxide thin film transistor (Oxide TFT) formed on the substrate S, where the oxide thin film transistor is a top gate structure. The oxide thin film transistor includes a second semiconductor pattern 670, a second gate pattern 693, a second source/drain electrode, and a second via hole 712. A region of the second semiconductor pattern 670 corresponding to the second via hole 712 is covered with a conductive protection portion, and the second source/drain electrode is connected to the conductive protection portion through the second via hole 712. In one embodiment, the region of the second semiconductor pattern 670 corresponding to the second via hole 712 is covered with the conductive protection portion, which means that an orthographic projection of the conductive protection portion on the substrate S covers an orthographic projection of the second via hole 712 on the substrate S, i.e., the orthographic projection of the conductive protection portion on the substrate S overlaps with the orthographic projection of the second via hole 712 on the substrate S. The low temperature polysilicon thin film transistor includes a first semiconductor pattern 620, a first via hole 711, a first source/drain electrode connected to the first semiconductor pattern 620 through the first via hole 711, and a first gate pattern 640 and a first metal pattern 691 formed over the first semiconductor pattern 620.

The array substrate includes a conductive protection portion formed on the second semiconductor pattern 670, the conductive protection portion includes a second metal pattern 692 and a third metal pattern 694 respectively disposed at two ends of the second semiconductor pattern 670. In a specific example, the second source/drain electrode may include a second source electrode 723 and a second drain electrode 724. The second source electrode 723 and the second drain electrode 724 are respectively connected to the second metal pattern 692 and the third metal pattern 694 through the second via hole 712, and the conductive protection portion may achieve electrical connection between the second source electrode 723 and the second semiconductor pattern 670 and between the second drain electrode 724 and the second semiconductor pattern 670, so that the oxide thin film transistor normally operates, and may also prevent damage to the second semiconductor pattern 670 when the first via hole 711 and the second via hole 712 are formed and when two via holes are cleaned with hydrofluoric acid. The second semiconductor pattern 670 is protected by the conductive protection portion, which functions etching stop, so that the first via hole 711 and the second via hole 712 can be implemented by one process. The formation of the first via hole 711 and the second via hole 712 may be patterned by using only one mask plate, so that the number of used mask plates can be reduced, the process flow of the array substrate can be reduced, the process can be simplified, and the cost can be reduced. In the present disclosure, a conductive protection portion is disposed in the region of the active layer of the oxide thin film transistor corresponding to the second via hole, and the active layer is effectively protected by the conductive protection portion, so that the normal cleaning of the second via hole 712 and the first via hole 711 with hydrofluoric acid can be realized after the via hole is fabricated by one composition process, thereby avoiding the influence of the hydrofluoric acid on the active layer of the oxide thin film transistor. Meanwhile, the oxide thin film transistor adopts a top gate structure, so that the conductive protection portion may be disposed on the same layer with the second gate pattern of the oxide thin film transistor, and the number of process steps can be reduced by one composition process.

In one embodiment, the substrate S includes a first region 600 and a second region 700, and a low temperature polysilicon thin film transistor may be formed in the first region 600 and an oxide thin film transistor may be formed in the second region 700 of the substrate S. In one embodiment, a first semiconductor pattern 620 is formed in the first region 600 and a second semiconductor pattern 670 is formed in the second region 700.

The material of the first semiconductor pattern 620 may be polysilicon acting as an active region of the low temperature polysilicon thin film transistor, and the material of the second semiconductor pattern 670 may be oxide acting as an active region of the oxide thin film transistor. The material of the oxide may be one of or combination of more of indium tin zinc oxide, Indium gallium oxide, indium gallium zinc oxide, indium tungsten oxide, zinc oxide, tin oxide, gallium zinc oxide and zinc tin oxide. In an alternative embodiment, the oxide thin film transistor may serve as a switching element of a pixel in a display region of a display panel, and the low temperature polysilicon thin film transistor may serve as a driving element of a drive circuit.

In one embodiment, a first gate insulating layer 680 is further formed on the second semiconductor pattern 670. In the present disclosure, due to the arrangement of the conductive protection portion, the number of mask plates used in the fabricating process of the array substrate may be reduced, and thus, in the present disclosure, the first gate insulating layer 680 may be formed by one composition process, so that the width W of the first gate insulating layer 680 is wider than the width of the second gate pattern on the first gate insulating layer 680, thereby avoiding a short channel effect caused by the small width W of the first gate insulating layer 680.

In one embodiment, the second gate pattern 693 may be made of the same metal material as the conductive protection portion, such as one or more of Al, Cr, Mo, and W. When the same metal material is selected, the second gate pattern 693 and the conductive protection portion may be formed by one composition process, which may save process steps and simplify the fabricating process of the array substrate.

In one embodiment, the low temperature polysilicon thin film transistor may include a first semiconductor pattern, a first source/drain electrode connected to the first semiconductor pattern through a first via hole, and a first gate pattern and a first metal pattern formed over the first semiconductor pattern.

A first metal pattern 691 is further formed on the first gate pattern 640 and, in some embodiments, the first metal pattern 691 may serve as a pixel electrode for controlling pixel display.

In one embodiment, the first metal pattern 691 may be made of the same metal material as the conductive protection portion, i.e., the first metal pattern 691 may be made of one of or combination of more of metals such as Al, Cr, Mo, or W. The first metal pattern 691 may be disposed on the same layer as the second gate pattern 693 and the conductive protection portion, and may be formed by one composition process, so as to save process steps and simplify the fabricating process of the array substrate.

The array substrate of the present disclosure can simultaneously form a low temperature polysilicon thin film transistor and an oxide thin film transistor through a more simplified process, and thus various combinations of the low temperature polysilicon thin film transistor and the oxide thin film transistor can be used, thereby enabling an organic electroluminescent display device excellent in image quality and capable of reducing power consumption to be obtained.

Figure 8:
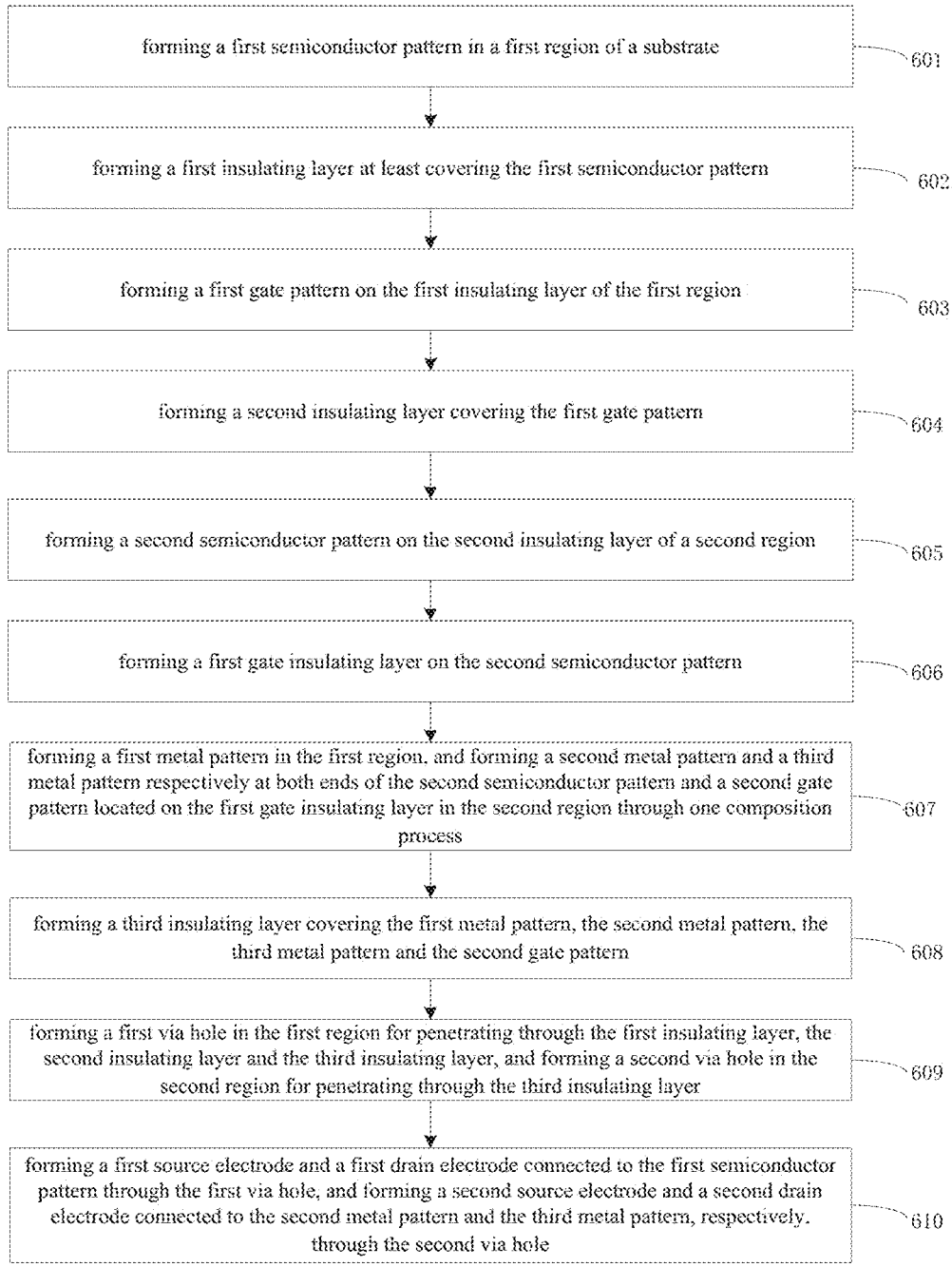
FIG. 8 is a flow chart of a fabricating method of a specific embodiment of an array substrate according to the present disclosure.

As shown in FIG. 8, the present embodiment further discloses a fabricating method of an array substrate, including:

S601: forming a first semiconductor pattern 620 in a first region 600 of a substrate S;

S602: forming a first insulating layer 630 at least covering the first semiconductor pattern 620;

S603: forming a first gate pattern 640 on the first insulating layer 630 of the first region 600;

S604: forming a second insulating layer 650 covering the first gate pattern 640;

S605: forming a second semiconductor pattern 670 on the second insulating layer 650 of a second region 700;

S606: forming a first gate insulating layer 680 on the second semiconductor pattern 670;

S607: forming a first metal pattern 691 in the first region 600, and forming a second metal pattern 692 and a third metal pattern 694 respectively at both ends of the second semiconductor pattern 670 and a second gate pattern 693 located on the first gate insulating layer 680 in the second region 700 through one composition process;

S608: forming a third insulating layer 710 covering the first metal pattern 691, the second metal pattern 692, the third metal pattern 694 and the second gate pattern 693;

S609: forming a first via hole 711 in the first region 600 for penetrating through the first insulating layer 630, the second insulating layer 650 and the third insulating layer 710, and forming a second via hole 712 in the second region 700 for penetrating through the third insulating layer 710; and S610: forming a first source electrode 721 and a first drain electrode 722 connected to the first semiconductor pattern 620 through the first via hole 711, and forming a second source electrode 723 and a second drain electrode 724 connected to the second metal pattern 692 and the third metal pattern 694, respectively, through the second via hole 712.

Specifically, FIGS. 9 to 18 are cross-sectional views illustrating a fabricating process of the array substrate in this embodiment.

Figure 9:
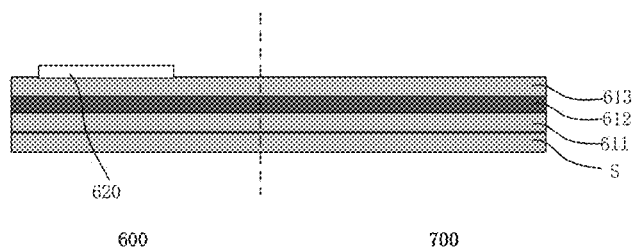
FIGS. 9 to 18 are schematic cross-sectional views illustrating a fabricating process of an array substrate of the present disclosure.

As shown in FIG. 9, a first semiconductor pattern 620 is formed in a first region 600 of a substrate S. In one embodiment, the substrate S of the array substrate may be made of quartz glass, alkali-free glass, silicon wafer, polyimide, plastic, or the like. The substrate S may have a plurality of first regions 600 and a plurality of second regions 700 (only one each is shown in the drawings) for enabling different types of transistors to be formed in two regions, respectively. For example, the oxide thin film transistor serves as a switching element of a pixel in the display region, and the low temperature polysilicon thin film transistor serves as a drive element of a drive circuit.

Alternatively, the material of the first semiconductor pattern 620 is polysilicon. The polysilicon semiconductor pattern may be formed by forming amorphous silicon (a-Si) in the first region 600 of the substrate S and then irradiating the amorphous silicon with excimer laser, so that the amorphous silicon may be converted into polysilicon silicon.

In an alternative embodiment, before forming the first semiconductor pattern 620, a flexible layer 611 may be formed on the substrate S, the flexible layer 611 may be made of polyimide (PI), and after the array substrate is completed, the substrate S may be removed to form the flexible display panel. In other embodiments, when the display device is not a flexible display device, the flexible layer 611 may not be provided, which is not limited by the present disclosure.

Before the first semiconductor pattern 620 is provided, a fifth insulating layer 612 and a first buffer layer 613 may be further provided, and the insulating layer and the buffer layer may function as an insulator and prevent impurities in the substrate S from contaminating the first semiconductor pattern 620. The insulating layer and the buffer layer may be made of common transparent insulating materials such as silicon nitride, silicon oxide or the like.

Figure 10:
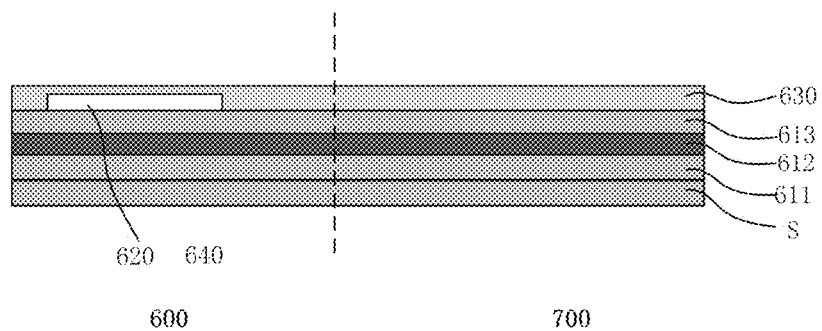

As shown in FIG. 10, a first insulating layer 630 at least covering the first semiconductor pattern 620 is formed on the first semiconductor pattern 620. The first insulating layer 630 at least covers the first semiconductor pattern 620, and may cover the first region 600, and may further cover the second region 700. The material of the first insulating layer 630 may be silicon nitride (Si3N4) or tetraethoxysilane (TEOS), and may be formed by chemical vapor deposition (CVD), which may be low pressure chemical vapor deposition, thermal vapor deposition, catalytic chemical vapor deposition, plasma enhanced chemical vapor deposition, etc., without limitation in this disclosure.

Figure 11:
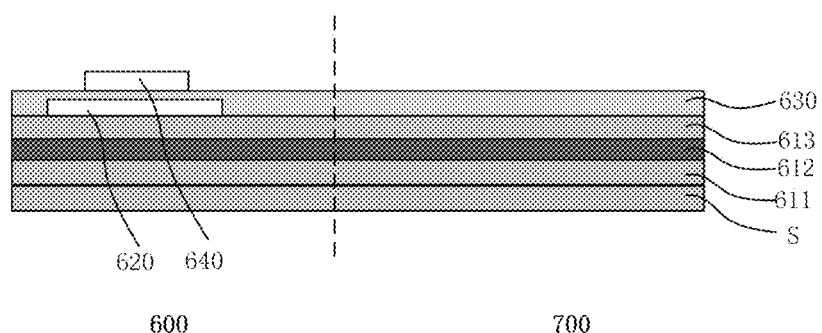

As shown in FIG. 11, a first gate pattern 640 is formed on the first insulating layer 630 of the first region 600. The position of the first gate pattern 640 corresponds to the first semiconductor pattern 620, and the first gate pattern serves as a gate electrode of the polysilicon transistor. The material of the first gate pattern 640 may be formed of one or more of Al, Cr, Mo, or W, and when a plurality of metals are used, the first gate pattern 640 is formed by a stacked film of various metals, or the like. The first gate pattern 640 may be formed by a coating process, including but not limited to vacuum evaporation, magnetron sputtering coating, ion sputtering coating, and the like.

Figure 12:
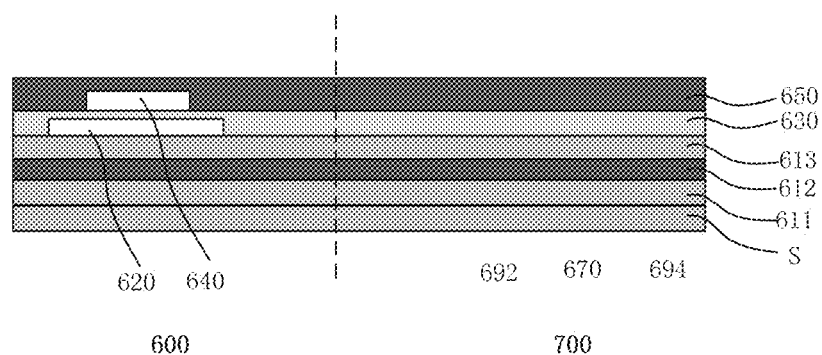

As shown in FIG. 12, a second insulating layer 650 covering the first gate pattern 640 is formed on the first gate pattern 640. The second insulating layer 650 at least covers the first gate pattern 640, and may further cover the first region 600, and may further cover the second region 700. In order to ensure the performance of the oxide thin film transistor, a second buffer layer 660 may be further formed on the second insulating layer 650. The second insulating layer 650 may be made of silicon nitride, the second buffer layer 660 may be made of silicon oxide, and the second buffer layer 660 formed of silicon oxide is in direct contact with the oxide thin film transistor.

The method of forming the second insulating layer 650 and the second buffer layer 660 is similar to the method of forming first insulating layer 630. In terms of a source gas for forming a silicon nitride layer, NH3, NH2H2N, N2, or the like, alternatively NH3 and N2, can be used as a nitrogen source gas, and SiH4, Si2H6, SiCl4, SiHCl3, SiH2Cl2, SiH3Cl3, SiF4, or the like, alternatively SiH4, can be used as a silicon source gas. The silicon nitride layer may also be formed by a chemical vapor deposition method (CVD).

It should be noted that, for the low temperature polysilicon thin film transistor, after the via hole connecting the source drain electrode and the active layer is formed, a surface of the polysilicon semiconductor pattern exposed through the via hole needs to be cleaned with hydrofluoric acid, and at the same time, the source/drain electrode needs to be fabricated within less than half an hour after cleaned with the hydrofluoric acid, otherwise, the cleaned polysilicon surface is contacted with water vapor or air and oxidized to form surface oxide again, which affects the lap-joint and reduces the cleaning effect. In order to further save the process flow and reduce the fabricating cost, it is necessary to firstly fabricate the second semiconductor pattern 670 (typically an oxide semiconductor layer, such as IGZO), and then perform dry etching and drilling, followed by sequentially performing hydrofluoric acid cleaning and source, drain electrodes deposition. Therefore, after the first gate insulating layer 680 is formed, a second semiconductor pattern 670 is formed in the second region 700, wherein the second semiconductor pattern 670 is an active layer of a transistor corresponding to the second region and may be made of a metal oxide, and at this time, the transistor corresponding to the second region 700 is an oxide thin film transistor.

Figure 13:
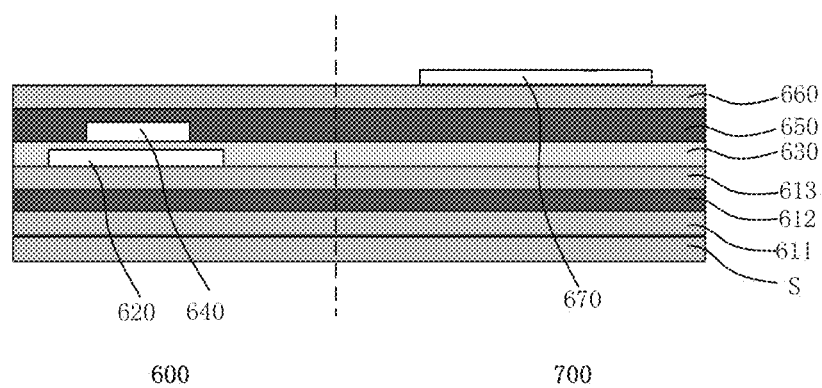

As shown in FIG. 13, a second semiconductor pattern 670 is formed on the second insulating layer 650 of the second region 700. The second semiconductor pattern 670 may be made of one of Indium Zinc Oxide (IZO), Indium-Tin-Zinc Oxide (ITZO), Indium Gallium Oxide (IGO), Indium Gallium Zinc Oxide (IGZO), Indium tungsten Oxide (IWO), Zinc Oxide (ZnO), Tin Oxide (SnO), Gallium-Zinc Oxide (GZO), and Zinc-Tin-Oxide (ZTO), or a combination of these materials. The second semiconductor pattern 670 may be formed by a film coating method including, but not limited to, vacuum evaporation, magnetron sputtering coating, ion sputtering coating, and the like. Taking IGZO as an example, the film can be fabricated by direct current magnetron sputtering, wherein the atomic ratio of a target material is that In2O3-Ga2O3-ZnO=1:1:1 (molar ratio), and the IGZO thin film meeting the application requirements can be obtained by adjusting parameters such as oxygen flow, deposition power, gas flow and the like.

Figure 14:
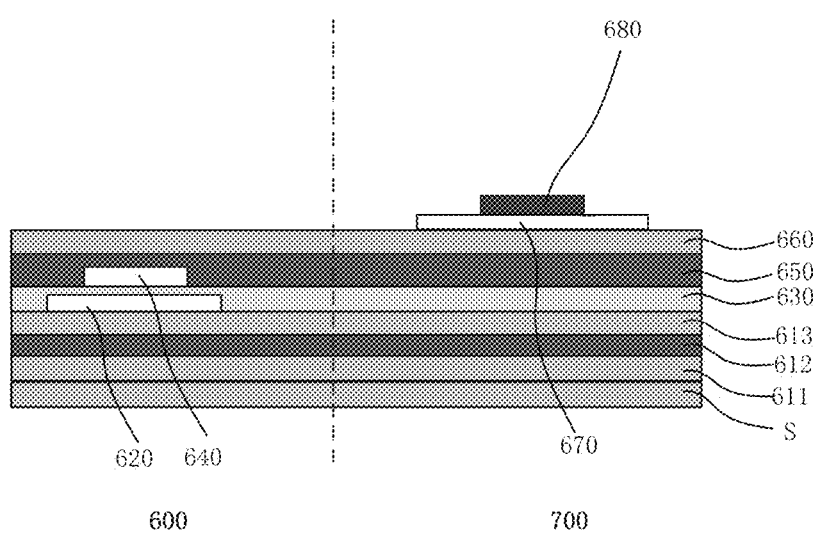

As shown in FIG. 14, a first gate insulating layer 680 is formed on the second semiconductor pattern 670. The first gate insulating layer 680 partially covers the second semiconductor pattern 670, and the first gate insulating layer 680 is disposed at a center of the second semiconductor pattern 670 to leave regions at both sides in which the second via hole 712 is disposed, so that the second semiconductor pattern 670 may be connected to the second source electrode 723 and the second drain electrode 724. In the present disclosure, the first gate insulating layer 680 is formed by one composition process, and a width W of the first gate insulating layer 680 may be controlled by the shape of a mask plate, so that the width W of the first gate insulating layer 680 may be appropriately increased by providing the mask plate, and the second semiconductor pattern 670 may be protected when the second semiconductor pattern 670 is conducted, thereby preventing a short channel effect.

Figure 15:
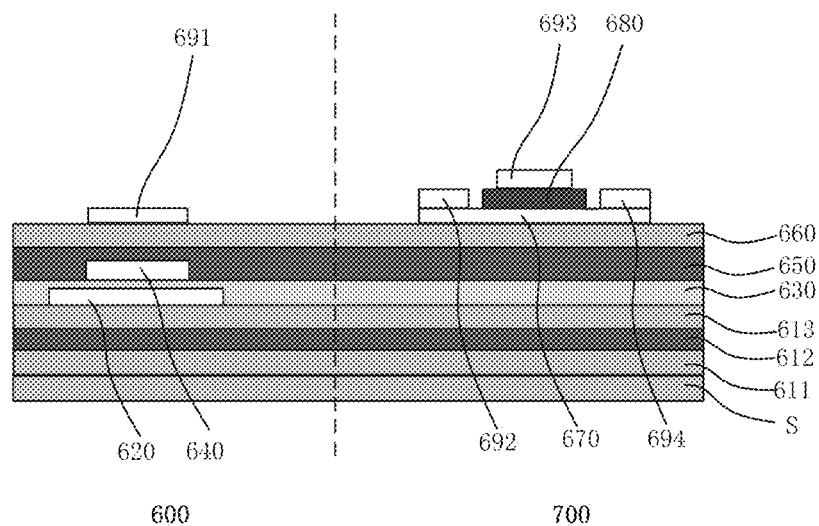

As shown in FIG. 15, a first metal pattern 691 is formed in the first region 600, and a second metal pattern 692 and a third metal patterns 694 and 694 respectively positioned at both ends of the second semiconductor pattern 670 and a second gate pattern 693 positioned on the first gate insulating layer 680 are formed in the second region 700 through one composition process. The first metal patterns 691, the second metal patterns 692 and the third metal patterns 694 and the second gate pattern 693 may be made of a material selected from metals that do not react or react very slowly with hydrofluoric acid (HF) at normal temperature, such as Mo.

The first metal pattern 691 is disposed on the second insulating layer 650 of the first region 600, and can be used as a trace for connecting with a low temperature polysilicon thin film transistor having different functions, for example, a connection line for connecting a switch transistor and a drive transistor; and may also correspond to the first gate pattern 640 to function as a storage capacitor for maintaining the pixel display of the light emitting unit.

The second metal pattern 692 and the third metal pattern 694 are respectively formed on two sides of the second semiconductor pattern 670 and connected thereto, and in consideration of the connection stability, a portion of each of the second metal pattern 692 and the third metal pattern 694 may be positioned at a side of the second semiconductor pattern 670 and another portion thereof may be positioned over the second semiconductor pattern 670 in a lap joint manner, so as to form a stable connection structure without easy disconnection.

Figure 16:
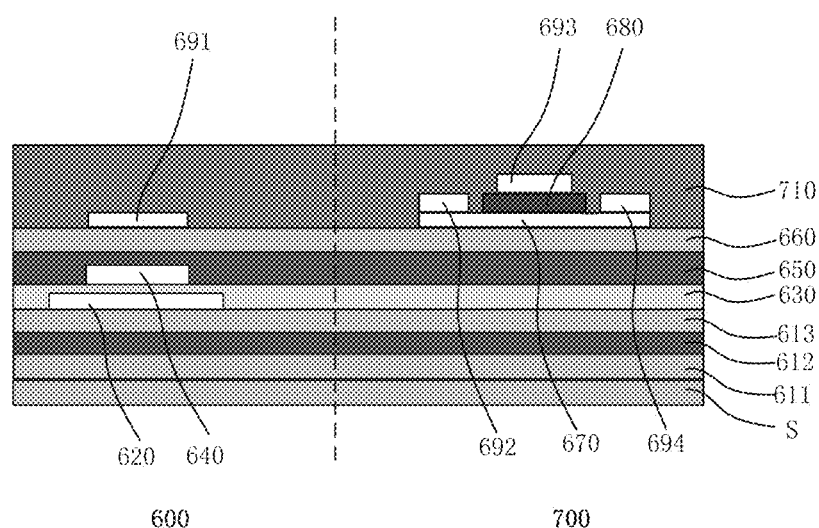

As shown in FIG. 16, a third insulating layer 710 covering the first metal pattern 691, the second metal pattern 692, the third metal pattern 694 and the second gate pattern 693 is further formed.

Figure 17:
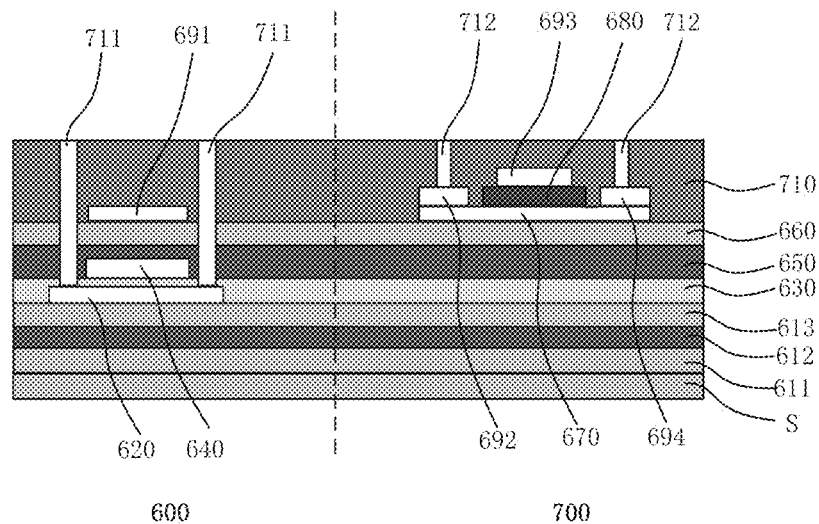

As shown in FIG. 17, after the third insulating layer 710 is formed, a first via hole 711 penetrating through the first insulating layer 630, the second insulating layer 650 and the third insulating layer 710 is formed in the first region 600, and a second via hole 712 penetrating through the third insulating layer 710 is formed in the second region 700. The first via hole 711 exposes the first semiconductor pattern 620, and the second via hole 712 exposes the second metal pattern 692 and the third metal pattern 694. In the array substrate of the present disclosure, the first via hole 711 and the second via hole 712 may be formed by one composition process, and may be performed simultaneously by using a dry etching method. The dry etching may be performed by using a CF-based (CF4) or CHF-based (CHF3) gas.

Since the first via hole 711 penetrates through the first insulating layer 630, the second insulating layer 650, and the third insulating layer 710, and the second via hole 712 penetrates only through the third insulating layer 710, a depth of the first via hole 711 is much greater than that of the second via hole 712. When the second via hole 712 is etched to expose the second metal pattern 692 and the second metal pattern 694 during the dry etching process, a portion of the first via hole 711 is still not etched, and the etching is continued to expose the first semiconductor pattern through the first via hole 711. At this time, the second metal pattern 692 and the third metal pattern 694 may block etching, preventing the second semiconductor pattern 670 from being etched away and damaging the active layer of the oxide thin film transistor.

After the first via hole 711 and the second via hole 712 are formed, a hydrogenation process may be performed on the LTPS to fill an interface state, a grain boundary state, an oxide layer defect and the like with hydrogen atoms, and the hydrogenation process may be performed by a plasma hydrogenation method, a solid diffusion method, a hydrogen ion implantation method, or the like.

The first insulating layer 630 is usually made of silicon oxide, and the polysilicon is easily oxidized by an oxygen atmosphere during the etching process, therefore, after the hydrogenation process, the first via hole 711 needs to be cleaned with hydrofluoric acid to remove the silicon oxide and the polymer on the polysilicon (p-Si) surface in the first via hole 711, so as to prevent the silicon oxide and the polymer from affecting the subsequent lap-joint and contact between the source/drain electrode and the polysilicon, thereby ensuring the device characteristics of LTPS. Since the second via hole 712 only exposes the second metal pattern 692 and the third metal pattern 694, the hydrofluoric acid does not contact and thus does not react with the second semiconductor pattern 670 when cleaned with the hydrofluoric acid, at the same time, the second metal pattern 692 and the third metal pattern 694 are limitedly corroded by the hydrofluoric acid, thereby preventing being completely corroded and contacting with the second semiconductor pattern 670. Thus, the oxide semiconductor can be prevented from being corroded by the hydrofluoric acid to cause damage, and the performance of the oxide thin film transistor is not affected.

Figure 18:
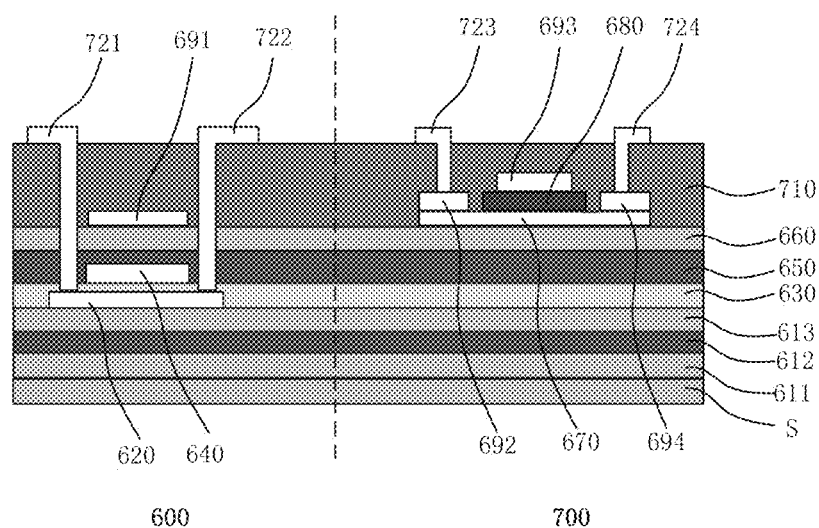

As shown in FIG. 18, after cleaned with the hydrofluoric acid, a first source electrode 721 and a first drain electrode 722 are formed on the first region 600, and a second source electrode 723 and a second drain electrode 724 are formed on the second region 700. In addition to low resistivity as a requirement of the transistor for the source/drain electrode, forming a good ohmic contact between the source/drain electrode and the semiconductor layer is another important requirement of the transistor for the source/drain electrode, so that the resistance between the drain electrode and the source electrode can be reduced, and the current crowding effect can be prevented.

The first source electrode 721, the first drain electrode 722, the second source electrode 723 and the second drain electrode 724 may be simultaneously formed by one composition process, and may be made of metal Ti, ITO, or the like, the metal Ti material not only has a good adhesion capability with the IGZO layer but also can reduce a contact resistance with the active layer. The ITO material also can form a good ohmic contact with the IGZO active layer due to its low resistivity, and has a good transparency.

A portion of each of the first source electrode 721 and the first drain electrode 722 is formed on the third insulating layer 710 and connected to the first semiconductor pattern 620 through two first via holes 711, respectively; the second source electrode 723 is connected to the second metal pattern 692 through one second via hole 712, the second drain electrode 724 is connected to the third metal pattern 694 through another second via hole 712, and the second metal pattern 692 and the third metal pattern 694 are respectively lap-jointed with the second semiconductor pattern 670, thereby achieving electrical connection between the second source electrode 723 and the second semiconductor pattern 670 and between the second drain electrode 724 and the second semiconductor pattern 670.

After the source/drain electrode is formed, a passivation layer may be further formed on the third insulating layer 710 to cover the source/drain electrode, and then the subsequent processes may be smoothly performed.

In the above description, the manner of the oxide thin film transistor is used in the display region and the low temperature polysilicon thin film transistor is used in the peripheral drive circuit is described, however, depending on product specifications, the oxide thin film transistor may be added to the peripheral circuit and the low temperature polysilicon thin film transistor may be added to the display region.

Based on the same principle, the present disclosure also discloses a display device including the array substrate of the above embodiment. The display device may be any product or component with a display function, such as a mobile phone, a tablet computer, a television, a display, a notebook computer, a digital photo frame, a navigator, an intelligent watch and the like. Of course, the display device of the present disclosure also has a structure such as an outer frame of a conventional display device, and the structure is a conventional technical means in the art, which will not be repeated herein.

In the embodiment, the conductive protection portion is disposed in a region of the active layer of the oxide thin film transistor corresponding to the second via hole, and the active layer is effectively protected by the conductive protection portion, so that the normal cleaning of hydrofluoric acid after the via hole are formed by the one composition process can be realized, thereby avoiding the influence of the hydrofluoric acid on the oxide semiconductor layer, simplifying the fabricating process, and reducing the production cost. Meanwhile, the oxide thin film transistor adopts a top gate structure, so that the conductive protection portion may be disposed on the same layer with the second gate pattern of the oxide thin film transistor, and the number of process steps can be reduced by one composition process.

The display device of the present disclosure includes the above array substrate, and the display device may be any product or component with a display function, such as a mobile phone, a tablet computer, a television, a display, a notebook computer, a digital photo frame, a navigator, and the like.

Of course, the display device of the present disclosure also has a structure of a frame or the like of a conventional display device.

It should be noted by those skilled in the art that the described embodiments of the present disclosure are merely exemplary, and that various other substitutions, alterations, and modifications may be made within the scope of the present disclosure. Accordingly, the present disclosure is not limited to the above described embodiments, but is only limited by the claims.

What is claimed is:

1. A fabricating method of an array substrate, wherein the array substrate comprises a first region and a second region, and the method comprising:

forming a first semiconductor pattern in the first region;

forming a first insulating layer at least covering the first semiconductor pattern;

forming a first gate pattern and a second gate pattern isolated from each other in the first region and the second region, respectively;

forming a second insulating layer at least covering the first gate pattern;

forming a second semiconductor pattern in the second region;

forming a first metal pattern in the first region and forming a second metal pattern and a third metal pattern respectively lap-jointed with the second semiconductor pattern in the second region by one film forming process;

forming a third insulating layer at least covering the second semiconductor pattern, the first metal pattern, the second metal pattern and the third metal pattern;

forming a first via hole penetrating through the first insulating layer, the second insulating layer, and the third insulating layer in the first region, and forming a second via hole penetrating through the third insulating layer in the second region; and forming a first source electrode and a first drain electrode, a second source electrode and a second drain electrode, wherein the first source electrode and the first drain electrode are respectively connected to the first semiconductor pattern through the first via hole, and the second source electrode and the second drain electrode are respectively connected to the second semiconductor pattern through the second via hole;

forming a first gate insulating layer on the second semiconductor pattern, wherein the second gate pattern is on the first gate insulating layer, and wherein the third insulating layer covers the second semiconductor pattern, the first metal pattern, the second metal pattern and the third metal pattern, and the first gate insulating layer and the second gate pattern, wherein the first semiconductor pattern, the first via hole, the first source electrode and the first drain electrode connected to the first semiconductor pattern through the first via hole, and the first gate pattern and the first metal pattern formed over the first semiconductor pattern constitute a low temperature polysilicon thin film transistor; and wherein the first metal pattern is made of a same material as the second metal pattern, the third metal pattern and the second gate pattern.

2. The fabricating method of the array substrate according to claim 1, wherein the first semiconductor pattern is made of polysilicon, and wherein the second semiconductor pattern is made of one of or combination of more of indium zinc oxide, indium tin zinc oxide, indium gallium oxide, indium gallium zinc oxide, indium tungsten oxide, zinc oxide, tin oxide, gallium zinc oxide and zinc tin oxide.

3. The fabricating method of the array substrate according to claim 1, wherein the second source electrode is connected to the second metal pattern through the second via hole, and the second drain electrode is connected to the third metal pattern through the second via hole.

4. The fabricating method of the array substrate according to claim 3, wherein a process of forming the first via hole and the second via hole comprises:
   forming the first via hole and the second via hole in a same exposure process; and
   cleaning the first via hole and the second via hole by hydrofluoric acid.

5. An array substrate, comprising:
   a substrate comprising a first region and a second region;
   a first semiconductor pattern located in the first region;
   a first insulating layer at least covering the first semiconductor pattern;
   a first gate pattern and a second gate pattern isolated from each other and disposed in the first region and the second region, respectively;
   a second insulating layer at least covering the first gate pattern;
   a first metal pattern located on the second insulating layer of the first region;
   a second semiconductor pattern located on the second insulating layer of the second region;
   a second metal pattern and a third metal pattern, which are located in the second region and respectively lap-jointed with the second semiconductor pattern;
   a third insulating layer at least covering the second semiconductor pattern, the first metal pattern, the second metal pattern and the third metal pattern;
   a first via hole located in the first region and penetrating the first insulating layer, the second insulating layer and the third insulating layer;
   a second via hole located in the second region and penetrating through the third insulating layer;
   a first source electrode and a first drain electrode; and
   a second source electrode and a second drain electrode,
   wherein the first source electrode and the first drain electrode are respectively connected to the first semiconductor pattern through the first via hole, and the second source electrode and the second drain electrode are respectively connected to the second semiconductor pattern through the second via hole;
   a first gate insulating layer located on the second semiconductor pattern, wherein the second gate pattern is located on the first gate insulating layer, and wherein the third insulating layer covers the second semiconductor pattern, the first metal pattern, the second metal pattern and the third metal pattern, and the first gate insulating layer and the second gate pattern,
   wherein the first semiconductor pattern, the first via hole, the first source electrode and the first drain electrode connected to the first semiconductor pattern through the first via hole, and the first gate pattern and the first metal pattern formed over the first semiconductor pattern constitute a low temperature polysilicon thin film transistor; and
   wherein the first metal pattern is made of a same material as the second metal pattern, the third metal pattern and the second gate pattern.

6. The array substrate according to claim 5, wherein the first semiconductor pattern is made of polysilicon, and wherein the second semiconductor pattern is made of one of or combination of more of indium tin zinc oxide, indium gallium oxide, indium gallium zinc oxide, indium tungsten oxide, zinc oxide, tin oxide, gallium zinc oxide, and zinc tin oxide.

7. The array substrate according to claim 5, wherein the second source electrode is connected to the second metal pattern through the second via hole, and the second drain electrode is connected to the third metal pattern through the second via hole.

8. The array substrate according to claim 5, wherein an orthographic projection of the second metal pattern and the third metal pattern on the substrate covers an orthographic projection of the second via hole on the substrate.

9. The array substrate according to claim 5, wherein the second metal pattern and the third metal pattern are disposed in a same layer as the second gate pattern.

10. The array substrate according to claim 5, wherein a width of the first gate insulating layer is greater than a width of the second gate pattern.

11. The array substrate according to claim 5, wherein the first metal pattern is disposed in a same layer as the second metal pattern, the third metal pattern and the second gate pattern.

12. The array substrate according to claim 5, wherein the second semiconductor pattern is made of one of or combination of more of indium tin zinc oxide, indium gallium oxide, indium gallium zinc oxide, indium tungsten oxide, zinc oxide, tin oxide, gallium zinc oxide and zinc tin oxide.

13. A display device comprising an array substrate, the array substrate comprising:
   a substrate comprising a first region and a second region;
   a first semiconductor pattern located in the first region;
   a first insulating layer at least covering the first semiconductor pattern;
   a first gate pattern and a second gate pattern isolated from each other and disposed in the first region and the second region, respectively;
   a second insulating layer at least covering the first gate pattern;
   a first metal pattern located on the second insulating layer of the first region;
   a second semiconductor pattern located on the second insulating layer of the second region;
   a second metal pattern and a third metal pattern, which are located in the second region and respectively lap-jointed with the second semiconductor pattern;
   a third insulating layer at least covering the second semiconductor pattern, the first metal pattern, the second metal pattern and the third metal pattern;
   a first via hole located in the first region and penetrating the first insulating layer, the second insulating layer and the third insulating layer;
   a second via hole located in the second region and penetrating through the third insulating layer;
   a first source electrode and a first drain electrode; and
   a second source electrode and a second drain electrode,
   wherein the first source electrode and the first drain electrode are respectively connected to the first semiconductor pattern through the first via hole, and the second source electrode and the second drain electrode are respectively connected to the second semiconductor pattern through the second via hole;

a first gate insulating layer located on the second semiconductor pattern, wherein the second gate pattern is located on the first gate insulating layer, and wherein the third insulating layer covers the second semiconductor pattern, the first metal pattern, the second metal pattern and the third metal pattern, and the first gate insulating layer and the second gate pattern, wherein the first semiconductor pattern, the first via hole, the first source electrode and the first drain electrode connected to the first semiconductor pattern through the first via hole, and the first gate pattern and the first metal pattern formed over the first semiconductor pattern constitute a low temperature polysilicon thin film transistor; and wherein the first metal pattern is made of a same material as the second metal pattern, the third metal pattern and the second gate pattern.

\* \* \* \* \*